United States Patent
Nishita et al.

(10) Patent No.: US 11,923,659 B2
(45) Date of Patent: Mar. 5, 2024

(54) OPTICAL MODULE, METHOD FOR CONTROLLING WAVELENGTH THEREOF, AND METHOD FOR CALIBRATION THEREOF

(71) Applicant: FURUKAWA ELECTRIC CO., LTD., Tokyo (JP)

(72) Inventors: Masayoshi Nishita, Tokyo (JP); Atsushi Yamamoto, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 852 days.

(21) Appl. No.: 16/991,086

(22) Filed: Aug. 12, 2020

(65) Prior Publication Data

US 2020/0373735 A1    Nov. 26, 2020

Related U.S. Application Data

(63) Continuation of application No. PCT/JP2019/005455, filed on Feb. 14, 2019.

(30) Foreign Application Priority Data

Feb. 14, 2018  (JP) .................................. 2018-024549

(51) Int. Cl.
*H01S 5/06* (2006.01)
*H01S 5/00* (2006.01)
(Continued)

(52) U.S. Cl.
CPC .......... *H01S 5/0612* (2013.01); *H01S 5/0078* (2013.01); *H01S 5/02407* (2013.01);
(Continued)

(58) Field of Classification Search
CPC .. H01S 5/0612; H01S 5/0078; H01S 5/02407; H01S 5/0687; H01S 5/06256;
(Continued)

(56) References Cited

U.S. PATENT DOCUMENTS 6,856,633 B2    2/2005  Nasu et al.
6,909,537 B2 *  6/2005  Kawahata .......... G02B 6/29358
                                                 398/147
(Continued)

FOREIGN PATENT DOCUMENTS

CN    1280310 A     1/2001
CN    101369713 A   2/2009
(Continued)

OTHER PUBLICATIONS

Combined Chinese Office Action and Search Report dated Oct. 18, 2022 in Chinese Patent Application No. 201980012794.4 (with English Translation of Office Action only), 11 pages.

(Continued)

*Primary Examiner* — Vu A Vu
(74) *Attorney, Agent, or Firm* — Oblon, McClelland, Maier & Neustadt, L.L.P.

(57) ABSTRACT

A method for controlling a wavelength of an optical module, includes: a laser light source unit emitting a laser beam; a wavelength filter having a periodical transmission characteristic with respect to a wavelength of light; a temperature controller on which the wavelength filter is placed and that adjusting a temperature of the wavelength filter; a heat generating body placed on the temperature controller; and a control device controlling the wavelength of the laser beam emitted from the laser light source unit and control the transmission characteristic of the wavelength filter based on an intensity of the laser beam transmitted through the wavelength filter, the method including changing at least one of a target value of the wavelength control of the laser beam and a target value of the control of the wavelength filter based on a current value of the heat generating body.

10 Claims, 10 Drawing Sheets

(51) Int. Cl.
  *H01S 5/024*       (2006.01)
  *H01S 5/0687*      (2006.01)
  *H04B 10/50*       (2013.01)
  *H04B 10/572*      (2013.01)

(52) U.S. Cl.
  CPC ......... *H01S 5/0687* (2013.01); *H04B 10/503* (2013.01); *H04B 10/572* (2013.01)

(58) Field of Classification Search
  CPC ....... H01S 5/50; H01S 5/4087; H04B 10/503; H04B 10/572
  USPC .......................................................... 372/20
  See application file for complete search history.

(56) References Cited

U.S. PATENT DOCUMENTS

| | | | |
|---|---|---|---|
| 8,693,891 B2* | 4/2014 | Nishihara | H04B 10/505 398/208 |
| 9,614,349 B2* | 4/2017 | Miyata | H01S 5/0687 |
| 10,506,311 B2* | 12/2019 | Jiang | H04Q 11/0005 |
| 2002/0186729 A1 | 12/2002 | Nasu et al. | |
| 2003/0043865 A1 | 3/2003 | Nasu et al. | |
| 2003/0108353 A1 | 6/2003 | Nasu et al. | |
| 2003/0123496 A1 | 7/2003 | Broutin et al. | |
| 2005/0117231 A1 | 6/2005 | Ueki et al. | |
| 2005/0190803 A1 | 9/2005 | Gronbach | |
| 2010/0246614 A1 | 9/2010 | Koshi et al. | |
| 2015/0103853 A1* | 4/2015 | Kurobe | H01S 5/06837 372/34 |
| 2016/0204569 A1* | 7/2016 | Kuzukami | H01S 3/0014 372/20 |

FOREIGN PATENT DOCUMENTS

| | | |
|---|---|---|
| CN | 102522697 A | 6/2012 |
| JP | 2003-060294 A | 2/2003 |
| JP | 2003-152271 A | 5/2003 |
| JP | 2003-158317 A | 5/2003 |
| JP | 2003-188468 A | 7/2003 |
| JP | 2003-258372 A | 9/2003 |
| JP | 2004-079989 A | 3/2004 |
| JP | 3717438 B2 | 11/2005 |
| JP | 2010-118433 A | 5/2010 |
| JP | 2010-232505 A | 10/2010 |

OTHER PUBLICATIONS

International Search Report dated May 7, 2019 in PCT/JP2019/005455 filed on Feb. 14, 2019, 2 pages.

* cited by examiner

OPTICAL MODULE, METHOD FOR CONTROLLING WAVELENGTH THEREOF, AND METHOD FOR CALIBRATION THEREOF

CROSS-REFERENCE TO RELATED APPLICATION(S)

This application is a continuation of International Application No. PCT/JP2019/005455, filed on Feb. 14, 2019 which claims the benefit of priority of the prior Japanese Patent Application No. 2018-024549, filed on Feb. 14, 2018, the entire contents of which are incorporated herein by reference.

BACKGROUND

The present disclosure relates to an optical module, a method for controlling a wavelength thereof, and a method for calibration thereof.

In the related art, in the field of wavelength division multiplexing (WDM) communication in which a plurality of optical signals having different wavelengths are multiplexed and simultaneously transmitted, the optical signals are required to be multiplexed at narrower wavelength spacing as the amount of information communication increases. To multiplex the optical signals at narrower wavelength spacing, the wavelength of a laser beam emitted from a laser device as a signal needs to be accurately controlled.

For this purpose, a technique of an optical module is known that uses an etalon filter capable of controlling a temperature to vary a wavelength transmission characteristic (refer to Japanese Patent No. 3717438). According to this technique, a light-emitting device for emitting a laser beam and the etalon filter are placed on the same temperature controller, and the temperature of the light-emitting device is adjusted to adjust the emission wavelength.

SUMMARY

There is a need for providing an optical module, a method for controlling a wavelength thereof, and a method for calibration thereof capable of preventing the lock wavelength from being drifted in the wavelength direction even when the optical power is changed in a case where the heat generating bodies are placed on the same temperature controller According to an embodiment, a method for controlling a wavelength of an optical module, includes: a laser light source unit emitting a laser beam; a wavelength filter having a periodical transmission characteristic with respect to a wavelength of light; a temperature controller on which the wavelength filter is placed and that adjusting a temperature of the wavelength filter; a heat generating body placed on the temperature controller; and a control device controlling the wavelength of the laser beam emitted from the laser light source unit and control the transmission characteristic of the wavelength filter based on an intensity of the laser beam transmitted through the wavelength filter, the method including changing at least one of a target value of the wavelength control of the laser beam and a target value of the control of the wavelength filter based on a current value of the heat generating body.

According to an embodiment, a method for calibrating an optical module, the optical module including: a laser light source unit emitting a laser beam; a wavelength filter having a periodical transmission characteristic with respect to a wavelength of light; a temperature controller on which the wavelength filter is placed and that adjusting a temperature of the wavelength filter; a heat generating body placed on the temperature controller; a first light receiving element receiving the laser beam which has not been transmitted through the wavelength filter, and output a current value based on an intensity of the received laser beam; a second light receiving element receiving the laser beam which has been transmitted through the wavelength filter, and output a current value based on an intensity of the received laser beam; and a control device controlling the wavelength of the laser beam emitted from the laser light source unit and control the transmission characteristic of the wavelength filter based on an intensity of the laser beam transmitted through the wavelength filter, the method including: fitting by performing wavelength calibration at a plurality of current values of the heat generating body, and performing fitting on at least one of a difference between a current ratio between the current value output from the first light receiving element and the current value output from the second light receiving element at a reference current value among the current values, and a current ratio between the current value output from the first light receiving element and the current value output from the second light receiving element at a current value other than the reference current value among the current values, and a difference between a wavelength filter temperature of the wavelength filter at the reference current value among the current values, and a wavelength filter temperature of the wavelength filter at a current value other than the reference current value among the current values; and recording a coefficient obtained by the fitting into a memory.

According to an embodiment, an optical module includes: a laser light source unit emitting a laser beam; a wavelength filter having a periodical transmission characteristic with respect to a wavelength of light; a temperature controller on which the wavelength filter is placed and that is configured to adjust a temperature of the wavelength filter; a heat generating body placed on the temperature controller; and a control device configured to control the wavelength of the laser beam emitted from the laser light source unit and control the transmission characteristic of the wavelength filter based on an intensity of the laser beam transmitted through the wavelength filter. Further, the control device changes at least one of a target value of the wavelength control of the laser beam and a target value of the control of the wavelength filter based on a current value of the heat generating body.

DETAILED DESCRIPTION

Figure 1:
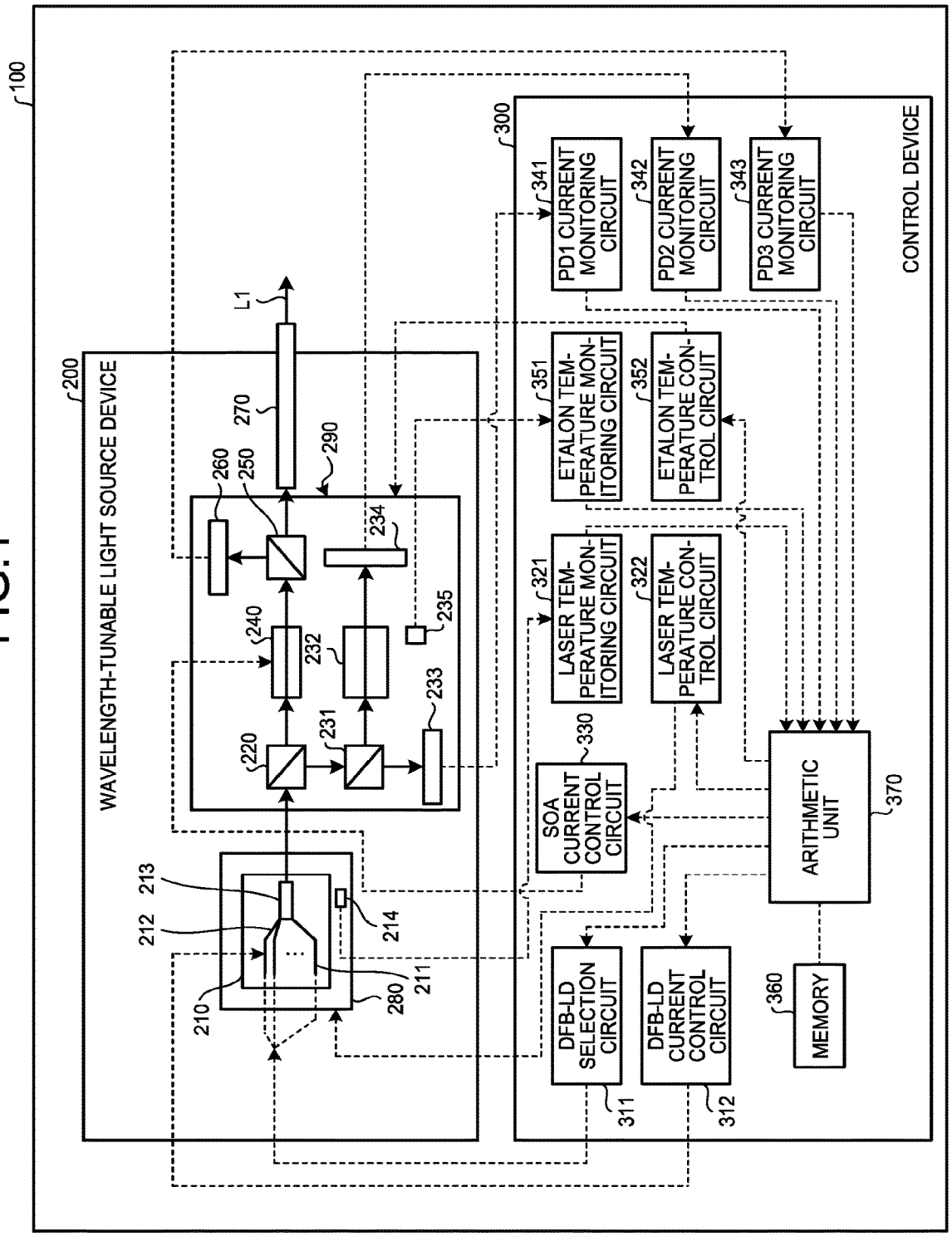
FIG. 1 is a block diagram schematically illustrating a configuration of an optical module according to a first embodiment of the present disclosure.

In these years, semiconductor laser modules use a semiconductor optical amplifier (SOA) to amplify a laser beam emitted by a semiconductor laser device to increase the power of the laser beam emitted from each of the semiconductor laser modules.

In Japanese Patent No. 3717438, however, the temperature of the etalon filter cannot be individually adjusted. Therefore, when heat generating bodies such as the SOA are placed on the same temperature controller, the heat generated by the heat generating bodies affects the etalon filter to cause a wavelength discrimination curve drift in the wavelength direction due an increase or decrease in current of the heat generating body. As a result, a problem occurs that the lock wavelength drifts in the wavelength direction as optical power changes.

The following describes in detail an optical module and a method for controlling a wavelength of the optical module according to embodiments of the present disclosure with reference to the drawings. The embodiments described below do not limit the present disclosure. In the drawings, the same or corresponding components are denoted by the same reference numerals as appropriate, and description thereof will not be repeated. It should be noted that the drawings are merely schematic, and, for example, thicknesses of layers and ratios between the thicknesses thereof differ from actual values. The drawings also include portions different from one another in the relations among dimensions and the ratios.

First Embodiment

Configuration of Optical Module

FIG. 1 is a block diagram schematically illustrating a configuration of an optical module according to a first embodiment of the present disclosure.

An optical module 100 illustrated in FIG. 1 illustrates a representative example of a device used for executing the method for controlling the wavelength and a method for calibration of the optical module according to the embodiments.

The optical module 100 illustrated in FIG. 1 includes a wavelength-tunable light source device 200 and a control device 300. Under the control of the control device 300, the wavelength-tunable light source device 200 emits a laser beam L1 having a predetermined wavelength and power, and supplies the laser beam L1 to a device at a subsequent stage. The control device 300 is connected to, for example, an upper-level control device provided with a user interface, and controls the wavelength-tunable light source device 200 according to an instruction from a user through the control device. In the optical module 100 according to the first embodiment, the wavelength-tunable light source device 200 and the control device 300 are mounted on the same circuit board. The present disclosure is, however, not limited to this configuration. The wavelength-tunable light source device 200 and the control device 300 may be separate from each other.

Configuration of Wavelength-Tunable Light Source Unit

The following describes the wavelength-tunable light source device 200.

The wavelength-tunable light source device 200 includes a laser light source unit 210, an optical demultiplexer 220, an optical demultiplexer 231, an etalon filter 232 serving as a wavelength filter, a power monitor 233 (hereinafter, simply called "PD1"), a wavelength monitor 234 (hereinafter, simply called "PD2"), a filter temperature monitoring element 235, an SOA 240, an optical demultiplexer 250, a power monitor 260 (hereinafter, simply called "PD3"), an optical fiber 270, a temperature controller 280 (hereinafter, simply called "TEC 280"), and a temperature controller 290 (hereinafter, simply called "TEC 290").

The laser light source unit 210 is placed on the TEC 280 with an unillustrated submount interposed therebetween. The laser light source unit 210 includes a plurality of stripe-shaped distributed feedback laser diodes (DFB-LDs) 211 that emit from a front end, laser beams having wavelengths different from one another, an optical waveguide 212, an optical multiplexer 213, and a laser temperature monitoring element 214.

Each of the DFB-LDs 211 can control the emission wavelength of the emitted laser beam by being controlled in temperature. Each of the DFB-LDs 211 is placed on the TEC 280, and is configured to be variable in temperature by the TEC 280. Each of the DFB-LDs 211 can change the emission wavelength within a range of approximately 3 nm to 4 nm. Therefore, the emission wavelength of each of the DFB-LDs 211 is designed by shifting the emission wavelength of the DFB-LD 211 at intervals of approximately 3 nm to 4 nm. With this configuration, the laser light source unit 210 selects one of the DFB-LDs 211 suitable for obtaining a desired laser beam wavelength and drives the selected DFB-LD 211, and in addition, the temperature of each of the DFB-LDs 211 is controlled. Thus, the laser beam can be emitted over a continuous wavelength bandwidth broader than that of the single DFB-LD 211.

To cover the whole wavelength bandwidth for WDM communication (for example, the C band of 1.53 μm to 1.56 μm or the L band of 1.57 μm to 1.61 μm), for example, 12 of the DFB-LDs 211 are integrated each capable of changing the emission wavelength within the range of approximately 3 nm to 4 nm. This configuration allows the laser light source unit 210 to change the wavelength of the laser beam over a wavelength bandwidth of 30 nm or broader. The laser beam emitted from any one of the DFB-LDs 211 is guided to one light path by being transmitted through the optical waveguide 212 and the optical multiplexer 213, and then emitted from the laser light source unit 210.

The laser temperature monitoring element 214 is placed on the TEC 280. The laser temperature monitoring element 214 detects the temperature of each of the DFB-LDs 211, and outputs the detection result to the control device 300. The laser temperature monitoring element 214 is configured using a thermistor.

The optical demultiplexer 220 transmits to the SOA 240 a part of the laser beam emitted from the laser light source unit 210, and reflects the rest of the laser beam to the optical demultiplexer 231. The optical demultiplexer 220 is configured using, for example, a beam splitter.

The optical demultiplexer 231 transmits a part of the laser beam incident from the optical demultiplexer 220 to the PD1 while reflecting the rest of the laser beam to the etalon filter 232. The optical demultiplexer 231 is configured using, for example, a beam splitter.

The etalon filter 232 has a periodical transmission characteristic with respect to the wavelength of light. The etalon filter 232 is placed on the TEC 290, and is configured to be variable in temperature by the TEC 290. In the first embodiment, the etalon filter 232 is used as the wavelength filter. The present disclosure is, however, not limited to this configuration. An interference filter formed of optical waveguides, such as a ring filter, can be used. In the first embodiment, only one etalon filter 232 is provided as the wavelength filter. The present disclosure is, however, not limited to this configuration. A plurality of wavelength filters may be provided. When a plurality of wavelength filters are provided, the filters may have characteristics different from each other, that is, for example, one may be the etalon filter 232 and the other may be the interference filter.

Figure 2:
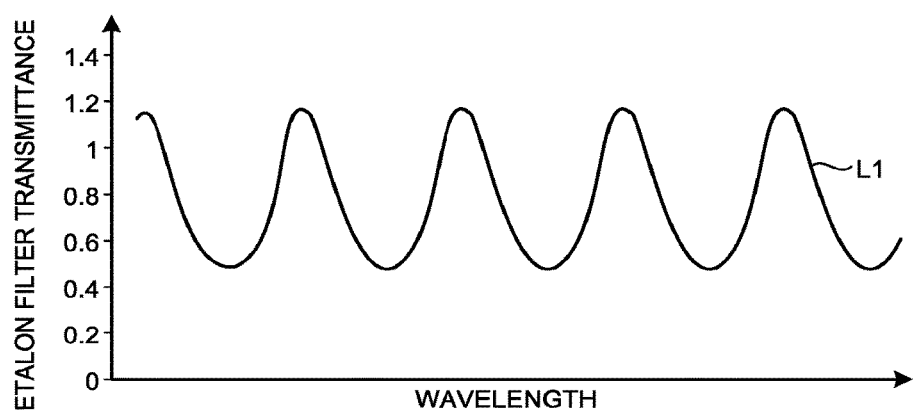
FIG. 2 is a diagram illustrating an example of a periodical transmission characteristic of an etalon filter.

FIG. 2 is a diagram illustrating an example of the periodical transmission characteristic of the etalon filter 232. In FIG. 2, the horizontal axis represents the wavelength, and the vertical axis represents transmittance of the etalon filter. As represented by a curve L1 illustrated in FIG. 2, the etalon filter 232 has the curved periodical transmission characteristic with respect to the wavelength of the laser beam, and selectively transmits the laser beam at an intensity according to the transmission characteristic to the PD2.

Referring back to FIG. 1, the description of the configuration of the wavelength-tunable light source device 200 will be continued.

The PD2 receives the laser beam transmitted through the etalon filter 232, and outputs a current signal corresponding to the received optical power to the control device 300. The PD2 is configured using a photodiode.

The PD1 receives the laser beam that has not been transmitted through the etalon filter 232 and has been transmitted through the optical demultiplexer 231, and outputs a current signal corresponding to the received optical power to the control device 300. The PD1 is configured using a photodiode.

The filter temperature monitoring element 235 is placed on the TEC 290. The filter temperature monitoring element 235 detects the temperature of the etalon filter 232, and outputs the detection result to the control device 300. The filter temperature monitoring element 235 is configured using a thermistor.

As described above, in a wavelength detection unit constituted by the optical demultiplexer 231, the PD1, the etalon filter 232, the PD2, and the filter temperature monitoring element 235, the etalon filter 232 has the periodical transmission characteristic with respect to the wavelength of light. Accordingly, in the first embodiment, when a ratio between the current signal output from the PD1 and the current signal output from the PD2 (hereinafter, called "PD current ratio") is considered, the PD current ratio (the current value of the PD2/the current value of the PD1) is also a periodical value with respect to the wavelength of light.

The periodical wavelength transmission characteristic of the etalon filter 232 shifts with temperature in the wavelength direction. The temperature coefficient of the shift depends on the material forming the etalon filter 232. For example, the temperature characteristic of the etalon filter 232 formed of quartz ($SiO_2$) is approximately 1.25 GHz/° C.; the temperature characteristic of the etalon filter 232 formed of crystalline quartz is approximately 1.9 GHz/° C.; and the temperature characteristic of the etalon filter 232 formed of bismuth germanium oxide (BGO, $Bi_{12}GeO_{20}$) is approximately 2.5 GHz/° C.

Figure 3:
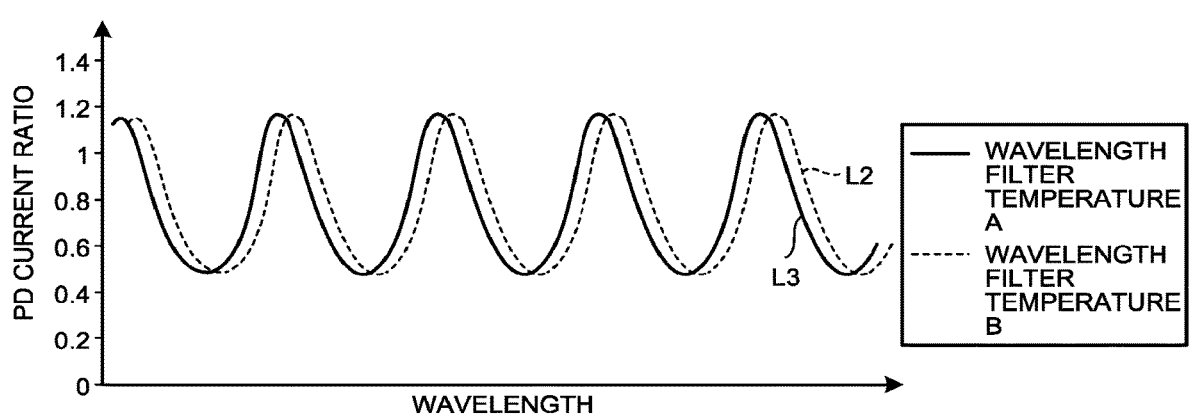
FIG. 3 is a graph illustrating an example of a PD current ratio at each of two temperatures of the etalon filter.

FIG. 3 is a diagram illustrating an example of the PD current ratio at each of two temperatures of the etalon filter 232. In FIG. 3, the horizontal axis represents the wavelength, and the vertical axis represents the PD current ratio. Also in FIG. 3, a curve L2 represents the transmission characteristic of the etalon filter 232 at a temperature A, and a curve L3 represents the transmission characteristic of the etalon filter 232 at a temperature B.

Each of the curves L2 and L3 illustrated in FIG. 3 is called a discrimination curve, and represents a relation between the measured PD current ratio and the wavelength of the output laser beam. Accordingly, using the discrimination curves L2 and L3 illustrated in FIG. 3 to monitor the PD current ratio, the control device 300 to be described later can detect an error in the wavelength of the laser beam output from the laser light source unit 210 when the error occurs. The control device 300 to be described later can also shift the discrimination curve in the wavelength direction by controlling the temperature of the etalon filter 232, and thus, can obtain a discrimination curve corresponding to a desired wavelength of the laser beam to be output from the laser light source unit 210.

Referring back to FIG. 1, the description of the configuration of the wavelength-tunable light source device 200 will be continued.

Under the control of the control device 300, the SOA 240 amplifies the laser beam incident from the optical demultiplexer 220, and emits the amplified laser beam to the optical demultiplexer 250.

The optical demultiplexer 250 reflects a part of the laser beam amplified by the SOA 240 to the PD3, and couples the rest of the laser beam to the optical fiber 270.

The PD3 receives the laser beam incident from the optical demultiplexer 250, and outputs a current signal corresponding to the received optical power to the control device 300. The PD3 is configured using a photodiode.

The optical fiber 270 emits the laser beam coupled by the optical demultiplexer 250 to supply the laser beam to the device at the subsequent stage, which is not illustrated.

The laser light source unit 210 is placed on the TEC 280. Under the control of the control device 300, the TEC 280 adjusts the temperature of the laser light source unit 210. The TEC 280 is configured using, for example, a Peltier element.

The optical demultiplexer 220, the optical demultiplexer 231, the etalon filter 232, the PD1, the PD2, the filter temperature monitoring element 235, the SOA 240, the optical demultiplexer 250, and the PD3 are placed on the TEC 290. Under the control of the control device 300, the TEC 290 adjusts the temperature of the etalon filter 232 and the SOA 240. The TEC 290 is configured using, for example, a Peltier element.

Configuration of Control Device

The following describes a detailed configuration of the control device 300.

The control device 300 illustrated in FIG. 1 includes a DFB-LD selection circuit 311, a DFB-LD current control circuit 312, a laser temperature monitoring circuit 321, a laser temperature control circuit 322, an SOA current control circuit 330, a PD1 current monitoring circuit 341, a PD2 current monitoring circuit 342, a PD3 current monitoring circuit 343, an etalon temperature monitoring circuit 351, an etalon temperature control circuit 352, a memory 360, and an arithmetic unit 370.

Under the control of the arithmetic unit 370, the DFB-LD selection circuit 311 selects one of the DFB-LDs 211. Specifically, under the control of the arithmetic unit 370, the DFB-LD selection circuit 311 selects one of the DFB-LDs 211 corresponding to a wavelength to be emitted, and a driving current is supplied thereto from the DFB-LD current control circuit 312 to be described later.

Under the control of the arithmetic unit 370, the DFB-LD current control circuit 312 supplies the driving current to the DFB-LD 211 selected by the DFB-LD selection circuit 311, and controls the driving current.

The laser temperature monitoring circuit 321 identifies the temperature of the DFB-LDs 211 based on the detection result received from the laser temperature monitoring element 214, and transmits the data of the identified temperature of the DFB-LDs 211 as a digital signal to the arithmetic unit 370.

The laser temperature control circuit 322 controls a current supplied to the TEC 280 such that the DFB-LDs 211 are at a temperature corresponding to an instruction signal received from the arithmetic unit 370.

The SOA current control circuit 330 controls a current supplied to the SOA 240 based on the instruction signal received from the arithmetic unit 370 so as to adjust a gain obtained by the SOA 240.

The PD1 current monitoring circuit 341 applies analog-to-digital (A/D) conversion processing to the current value received from the PD1 to convert the current value into a digital signal, and outputs the digital signal to the arithmetic unit 370.

The PD2 current monitoring circuit 342 applies the A/D conversion processing to the current value received from the PD2 to convert the current value into a digital signal, and outputs the digital signal to the arithmetic unit 370.

The PD3 current monitoring circuit 343 applies the A/D conversion processing to a current value received from the PD3 to convert the current value into a digital signal, and outputs the digital signal to the arithmetic unit 370.

The etalon temperature monitoring circuit 351 identifies the temperature of the etalon filter 232 based on the detection result received from the filter temperature monitoring element 235, and outputs the data of the identified temperature of the etalon filter 232 as a digital signal to the arithmetic unit 370.

The etalon temperature control circuit 352 controls a current supplied to the TEC 290 such that the etalon filter 232 is at a temperature corresponding to an instruction signal received from the arithmetic unit 370.

The memory 360 records data including at least one or more of a laser temperature of the laser light source unit 210, an etalon filter temperature (hereinafter, simply called "etalon temperature") of the etalon filter 232, an etalon temperature offset thereof, a DFB-LD current, an SOA power monitor PD current value or a PD current ratio as a feedback control target value, and a current ratio offset of the PD current ratio, as an initial value or values for each wavelength channel. These pieces of data are acquired by a wavelength calibration method using a wavelength meter and recorded in the memory 360 before shipping the wavelength-tunable light source device 200. The memory 360 also records various programs to be executed by the arithmetic unit 370 to be described later.

The arithmetic unit 370 controls the control circuits or the selection circuit based on the data received from the monitoring circuits to control the wavelength-tunable light source device 200 so as to emit the laser beam having a desired wavelength and power. The arithmetic unit 370 is configured using, for example, a central processing unit (CPU), an application specific integrated circuit (ASIC), and a field-programmable gate array (FPGA). The arithmetic unit 370 changes at least one of a target value of wavelength control of the laser beam emitted by the laser light source unit 210 and a target value of control of the etalon filter 232 serving as the wavelength filter based on the current value supplied to the SOA 240 serving as a heat generating body. Specifically, based on the current value supplied to the SOA 240 serving as the heat generating body, the arithmetic unit 370 changes a correction amount from an initial value of at least one of the target value of wavelength control of the laser beam emitted by the laser light source unit 210 and the target value of control of the etalon filter 232 serving as the wavelength filter. More specifically, the arithmetic unit 370 uses a quadratic function of the current value supplied to the SOA 240 serving as the heat generating body to calculate the correction amount from the initial value of the target value. The initial value of the target value can be selected as appropriate within a range of current conducted in the SOA 240 serving as the heat generating body. For example, the arithmetic unit 370 may select any one of an upper limit value, a lower limit value, and a center value of the range of current.

The arithmetic unit 370 controls the DFB-LD current control circuit 312 to supply a constant current having the initial value recorded in the memory 360 to the DFB-LDs 211. The arithmetic unit 370 controls a driving current supplied by the etalon temperature control circuit 352 to the TEC 290 based on the temperature of the etalon filter 232 received from the etalon temperature monitoring circuit 351 so as to control the temperature of the etalon filter 232 to be constant at the target value recorded in the memory 360.

Figure 4:
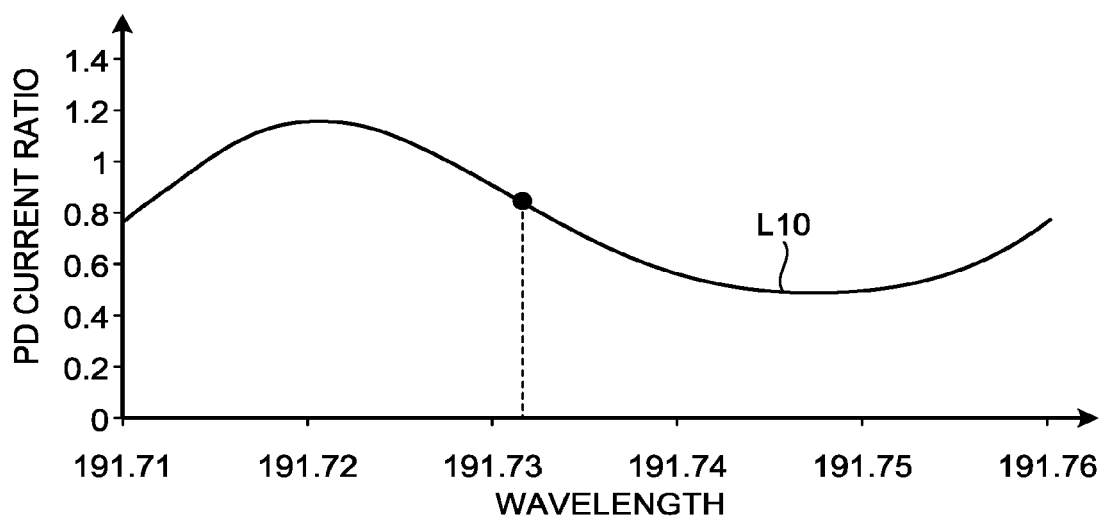
FIG. 4 is a diagram illustrating a relation between a PD current value and a wavelength.

In addition, as illustrated by a curve L10 in FIG. 4, the arithmetic unit 370 controls a driving current supplied by the laser temperature control circuit 322 to the TEC 280 based on the temperature of each of the DFB-LDs 211 detected by the laser temperature monitoring circuit 321 so as to adjust the temperature of the DFB-LD 211 to adjust the emission wavelength of the DFB-LD 211, thus performing feedback control (automatic frequency control (AFC)) with the target value of the PD current ratio set to the value (initial value) recorded in the memory 360 to keep the wavelength constant.

Figure 5:
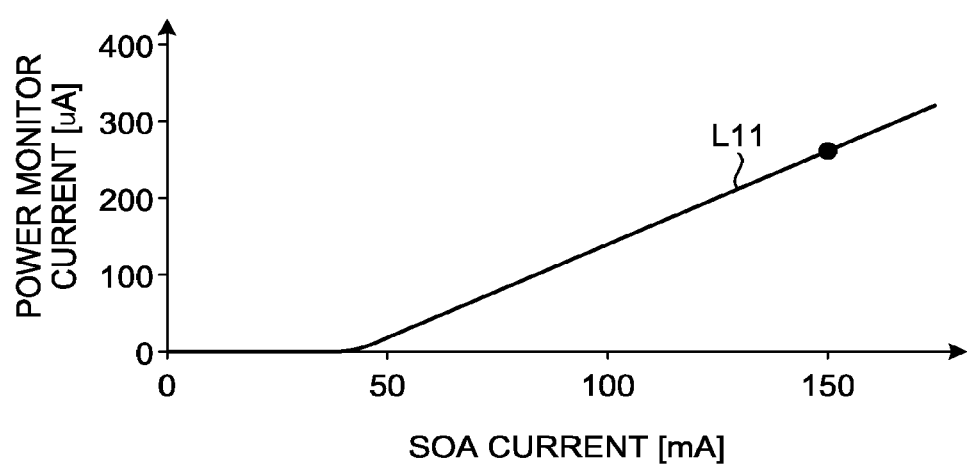
FIG. 5 is a diagram illustrating a relation between a power monitor current and an SOA current.

Moreover, as illustrated by a broken line L11 in FIG. 5, the arithmetic unit 370 controls the SOA current supplied by the SOA current control circuit 330 so as to perform feedback control (automatic power control (APC)) with the target value of the current value of the power monitor 260 set to the initial value recorded in the memory 360 to keep the fiber output power constant.

Influence of Heat Generated by SOA Current on Etalon Temperature

The following describes an influence of the heat generated by the current of the SOA 240 on the etalon temperature.

Since the current flowing in the SOA 240 generates the heat, the SOA 240 affects the temperature sensed by the etalon filter 232 placed on the same TEC 290. The temperature also changes when the SOA current of the SOA 240 is changed for adjusting the fiber output power. Therefore, although the arithmetic unit 370 controls the TEC 290 so as to keep the detected temperature of the filter temperature monitoring element 235 constant, when the temperature sensed by the etalon filter 232 is changed by the change in the heat generated by the SOA 240, the wavelength discrimination curve shifts in the wavelength direction according to the temperature characteristic of the etalon filter 232, and thus, the emission wavelength is also shifted by the AFC. To solve this problem, a method can be considered in which the filter temperature monitoring element 235 is disposed in a position where the temperature, including the influence of the heat generated by the SOA 240, sensed by the etalon filter 232 can be detected. However, in recent years, an increase in communication traffic has caused communication devices to be implemented as high density devices in order to increase communication capacities. As a result, the wavelength-tunable light source device 200 is required to be smaller in size. Therefore, an optimal position of the etalon temperature monitoring element may not be ensured.

As a method to solve this problem, the wavelength calibration is performed for each of a plurality of fiber output power values using the wavelength meter before shipping, and the data of the etalon temperature of the etalon filter 232 or the PD current ratio is acquired and recorded in the memory 360 of the wavelength-tunable light source device 200 for each of the fiber output power values. During the driving, the arithmetic unit 370 uses for the control, the etalon temperature or the PD current ratio different for each of the fiber output power values. However, due to deterioration with time, the SOA current of the wavelength-tunable light source device 200 differs (generally increases) from that at the time of shipping even if the fiber output power is the same as that at the time of shipping. As a result, after the deterioration with time, when the wavelength-tunable light source device 200 uses the data of the etalon temperature or the PD current ratio for each of the fiber output power values recorded in the memory 360 at the time of shipping, the laser beam is emitted at a wavelength shifted from the desired wavelength. Therefore, in the first embodiment, the following method is used to prevent the wavelength of the laser beam emitted by the wavelength-tunable light source device 200 from shifting.

Countermeasure against Wavelength Shift Caused by Influence of Heat Generated by SOA on Etalon Temperature The following describes a countermeasure against the wavelength shift caused by the influence of the heat generated by the SOA 240 on the etalon temperature.

Generated heat $Q_{soa}$ of the SOA 240 can be represented by Expression (1) below using a driving voltage $V_{soa}$ of the SOA 240, an SOA current $I_{soa}$ of the SOA 240, and optical power $P_{soa}$ from the SOA 240.

$$Q_{soa}=I_{soa}*V_{soa}-P_{soa} \quad (1)$$

Figure 6:
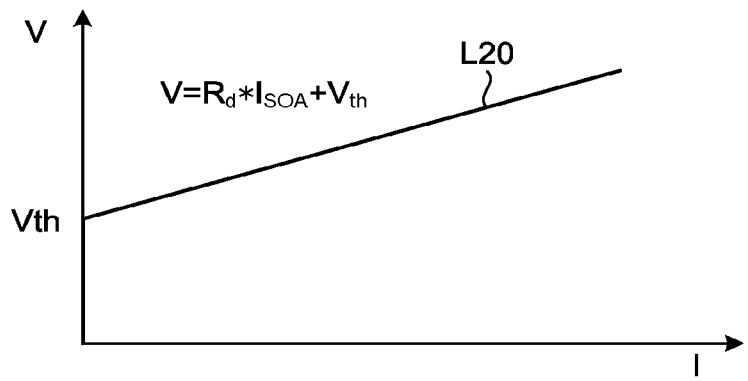
FIG. 6 is a diagram illustrating a relation between a driving voltage of the SOA and the SOA current.

As illustrated by a straight line L20 in FIG. 6, the driving voltage $V_{soa}$ of the SOA 240 can be represented by Expression (2) below using the SOA current $I_{soa}$ of the SOA 240, a series resistance $R_d$ of the SOA 240, and a threshold voltage $V_{th}$ of the etalon filter 232.

$$V_{soa}=R_d*I_{soa}+V_{th} \quad (2)$$

Substituting Expression (2) into Expression (1), the generated heat $Q_{soa}$ from the SOA 240 can be represented by Expression (3).

$$Q_{soa}=I_{soa}*(R_d*I_{soa}+V_{th})-P_{soa} \quad (3)$$

That is, the generated heat $Q_{soa}$ of the SOA 240 can be represented using a square of the SOA current $I_{soa}$. Accordingly, in the state where the control device 300 controls the TEC 290 so as to keep the detected temperature of the filter temperature monitoring element 235 constant, a shift amount of the wavelength discrimination curve in the wavelength direction caused by the change in the temperature sensed by the etalon filter 232 due to the change in the SOA current can be represented using the square of the SOA current.

Figure 7:
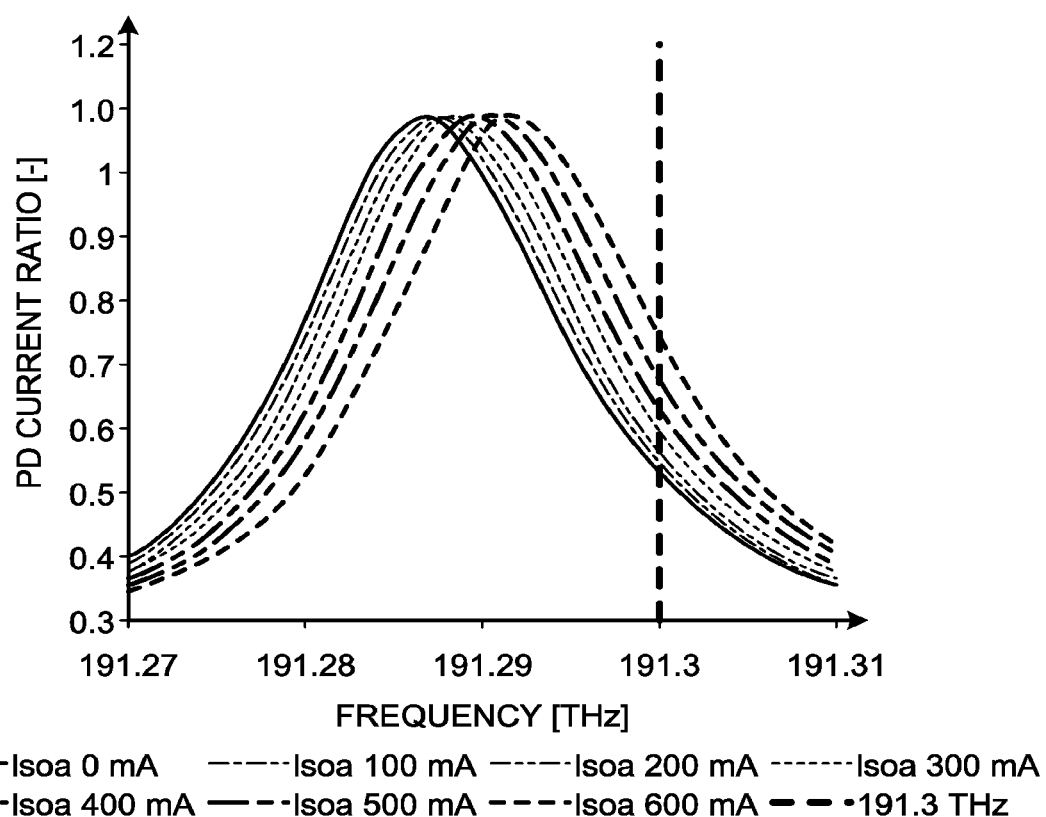
FIG. 7 is a diagram illustrating wavelength discrimination curves.
Figure 8:
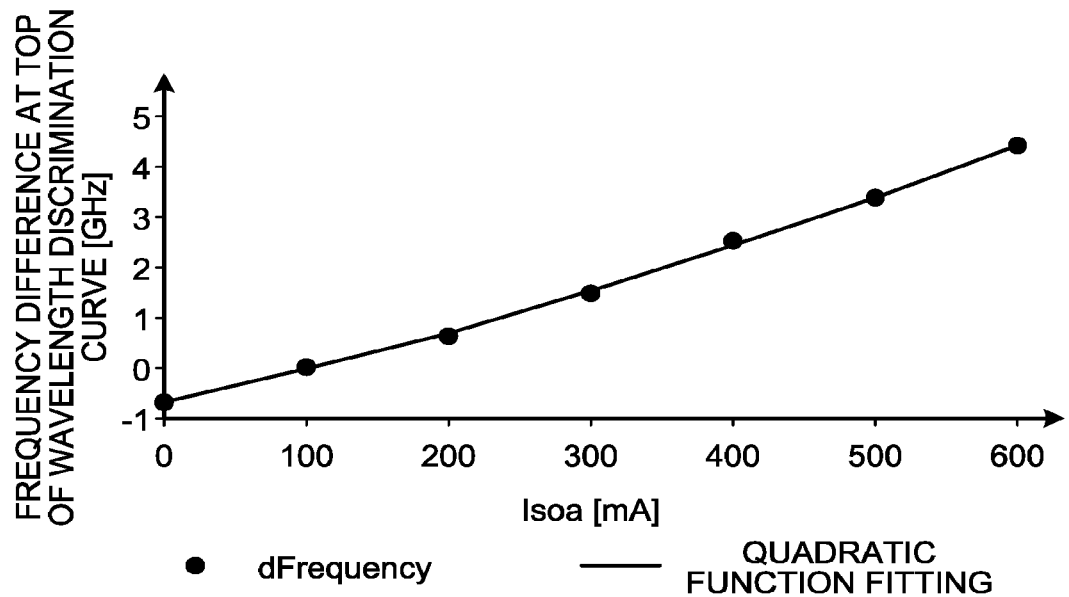
FIG. 8 is a diagram illustrating a frequency difference at the top of each of the wavelength discrimination curves.
Figure 9:
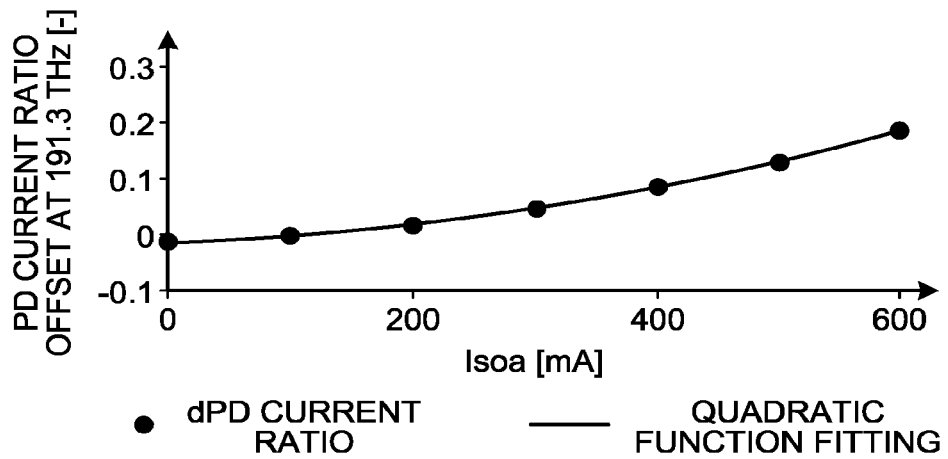
FIG. 9 is a diagram illustrating an $I_{soa}$ dependence of a PD current ratio offset at 191.3 THz.
Figure 10:
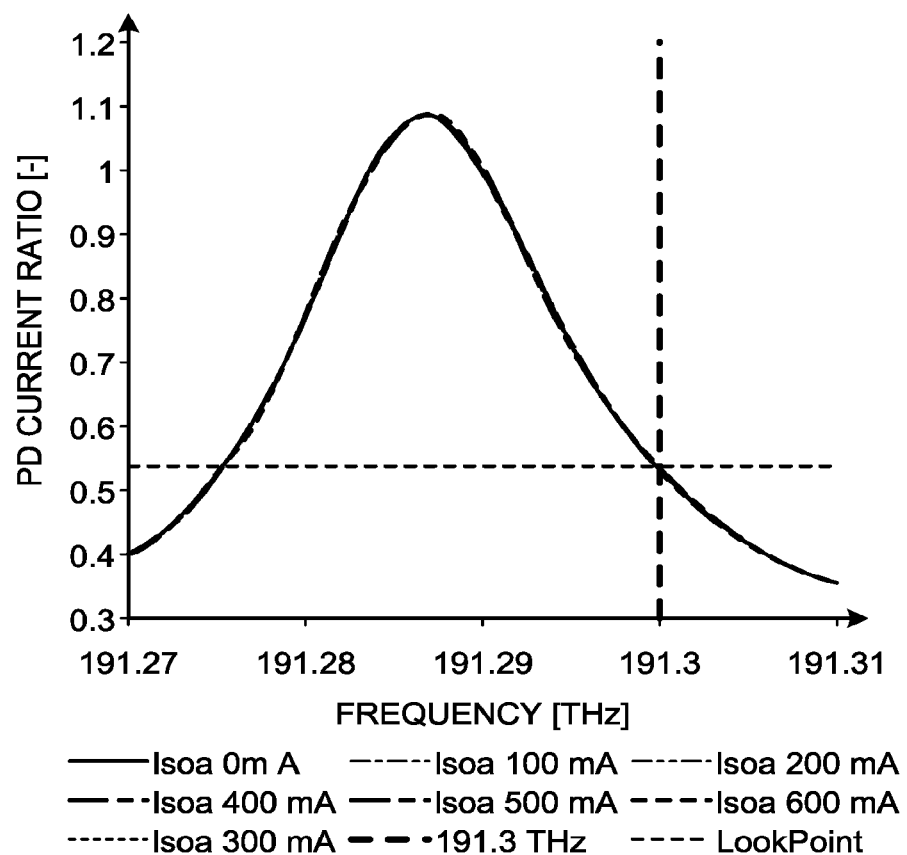
FIG. 10 is a diagram illustrating the wavelength discrimination curves.
Figure 11:
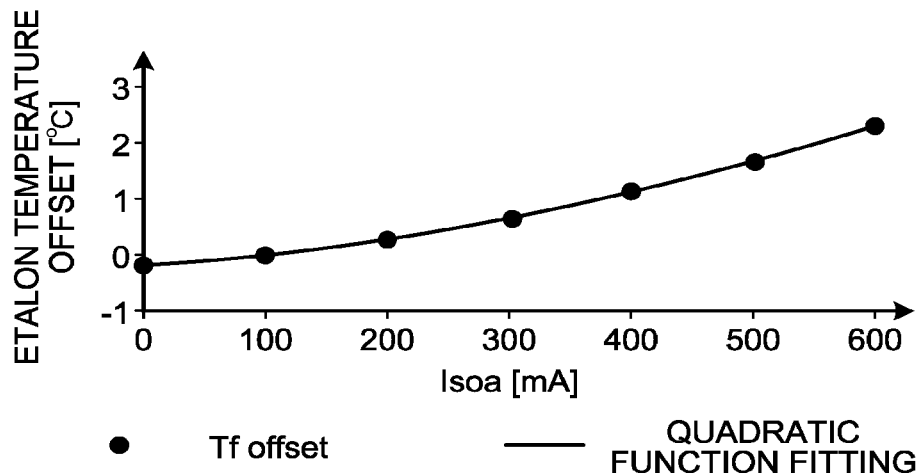
FIG. 11 is a diagram illustrating an etalon temperature offset.

FIG. 7 is a diagram illustrating the wavelength discrimination curves. FIG. 8 is a diagram illustrating a frequency difference at the top of each of the wavelength discrimination curves. FIG. 9 is a diagram illustrating an $I_{soa}$ dependence of the PD current ratio offset at 191.3 THz. FIG. 10 is a diagram illustrating the wavelength discrimination curves. FIG. 11 is a diagram illustrating the etalon temperature offset. In FIGS. 7 and 10, the horizontal axis represents a frequency, and the vertical axis represents the PD current ratio. In FIG. 8, the horizontal axis represents the SOA current, and the vertical axis represents the frequency difference at the top of the wavelength discrimination curve. In FIG. 9, the horizontal axis represents the SOA current, and the vertical axis represents the $I_{soa}$ dependence of the PD current ratio offset at 191.3 THz. In FIG. 11, the horizontal axis represents the SOA current, and the vertical axis represents the etalon temperature offset.

As illustrated in FIG. 7, changing the SOA current $I_{soa}$ normally drifts the wavelength discrimination curve in the wavelength direction. In FIG. 7, the wavelength discrimination curve when the SOA current $I_{soa}$ is 100 mA was used as a reference, and the frequency difference between the top of the reference wavelength discrimination curve and the top of the wavelength discrimination curve for each of the SOA currents $I_{soa}$ was plotted in FIG. 8. As a result, as illustrated in FIG. 8, the frequency difference is found to be representable by a quadratic function of the SOA current $I_{soa}$. FIG. 8 also illustrates that, when the AFC is performed with the target value set to a fixed PD current ratio regardless of the value of the SOA current $I_{soa}$, changing the SOA current $I_{soa}$ drifts the output wavelength in the order of Gigahertz. Next, in FIG. 7, the PD current ratio at 191.3 THz of the wavelength discrimination curve for the SOA current $I_{soa}$ of 100 mA was used as a reference, and the difference (PD current ratio offset) from the reference of the PD current ratio at 191.3 THz for each of the SOA currents $I_{soa}$ was plotted in FIG. 9. As a result, as illustrated in FIG. 9, the difference is found to be fittable with a quadratic function of the SOA current $I_{soa}$. That is, even in the case where changing the SOA current $I_{soa}$ drifts the wavelength discrimination curve in the wavelength direction as illustrated in FIG. 7, when the PD current ratio target value is changed with the SOA current $I_{soa}$ according to the quadratic function fitting of FIG. 9, the output wavelength stays at 191.3 THz even if the SOA current $I_{soa}$ is changed. Thus, high wavelength accuracy can be achieved. As illustrated in FIG. 10, so as to prevent the wavelength discrimination curve from being drifted by the change in the SOA current $I_{soa}$, the etalon temperature when the SOA current $I_{boa}$ is 100 mA is used as a reference, and the etalon temperature offset is provided for each of the SOA currents $I_{soa}$. Thus, the etalon temperature can be corrected. As a result, even if the AFC is performed with the target value set to a fixed PD current ratio regardless of the value of the SOA current $I_{soa}$, the output wavelength stays at 191.3 THz when the SOA current $I_{soa}$ is changed. Thus, the high wavelength accuracy can be achieved. As illustrated in FIG. 11, when the etalon temperature offset is plotted for each of the SOA currents $I_{soa}$, the etalon temperature offset is found to be fittable with a quadratic function of the SOA current $I_{soa}$.

To keep the same wavelength even if the SOA current changes, the arithmetic unit 370 uses one of the following two correction methods.

A correction method (Correction Method 1) of changing the PD current ratio target value as a function of the square of the SOA current while keeping the same etalon temperature target value, as illustrated in FIGS. 7 to 9.

A correction method (Correction Method 2) of changing the etalon temperature target value as a function of the square of the SOA current while keeping the same PD current ratio target value, as illustrated in FIGS. 10 and 11.

That is, the arithmetic unit 370 uses the initial value recorded in the memory 360 as the etalon temperature target value before the fiber output. Then, after starting to conduct the current to the SOA to output the light from the wavelength-tunable light source device 200, the arithmetic unit 370 calculates the correction amount from the initial value of the PD current ratio target value or the etalon temperature target value, and uses the correction amount to correct the PD current ratio target value or the etalon temperature target value.

Wavelength Calibration Methods

The following describes the wavelength calibration methods.

First, the control device 300 performs the wavelength calibration at the SOA currents of three or more levels for each of a plurality of wavelength channels. Specifically, the control device 300 sets the SOA current at, for example, three levels of 100 mA, 300 mA, and 500 mA, and performs wavelength measurement at the three levels, and the control device 300 adjusts the emission wavelength at each of the SOA currents so as to obtain a measurement value of the wavelength equal to the set wavelength, and obtains the PD current ratio and the etalon temperature at each of the SOA currents. Next, the control device 300 selects either one of parameters of the PD current ratio offset and the etalon temperature offset, and uses a value of the selected parameter at the SOA current of 100 mA as a reference to fit a difference of the selected parameter from the reference with a quadratic function (fitting step), and the control device 300 records a coefficient of the selected parameter obtained by the fitting in the memory 360 (recording step). In the case where the PD current ratio offset is selected, the control device 300 keeps the etalon temperature constant regardless of the SOA current during the wavelength measurement. In the case where the etalon temperature offset is selected, the control device 300 keeps the PD current ratio constant regardless of the SOA current during the wavelength measurement. In either of these cases, the control device 300 records the values of the PD current ratio and the etalon temperature at the reference (when the SOA current is 100 mA) as initial values in the memory 360, and further records a coefficient of a parameter selected from the parameters of the PD current ratio offset and the etalon temperature offset in the memory 360.

Alternatively, the control device 300 performs the wavelength calibration at the SOA currents of three or more levels using a certain wavelength channel. Specifically, the control device 300 sets the SOA current at, for example, the three levels of 100 mA, 300 mA, and 500 mA, and performs the wavelength measurement at the three levels, and the control device 300 adjusts the emission wavelength at each of the SOA currents so as to obtain a measurement value of the wavelength equal to the set wavelength, and obtains the PD current ratio and the etalon temperature at each of the SOA currents. Next, the control device 300 selects either one of the parameters of the PD current ratio offset and the etalon temperature offset, and uses a value of the selected parameter at the SOA current of 100 mA as a reference to fit a difference of the selected parameter from the reference with a quadratic function, and the control device 300 records a coefficient of the selected parameter obtained by the fitting in the memory 360. In the case where the etalon temperature offset is selected, the control device 300 keeps the PD current ratio constant regardless of the SOA current during the wavelength measurement. In the case where the etalon temperature offset is selected, the control device 300 keeps the PD current ratio constant regardless of the SOA current during the wavelength measurement. The control device 300 may apply the above-mentioned coefficient of the PD current ratio offset or the etalon temperature offset to different wavelength channels. This method can reduce the number of conditions of the wavelength calibration, and thus can contribute to productivity.

Further alternatively, the control device 300 performs the wavelength calibration at the SOA currents of three or more levels using a certain wavelength channel of a certain wavelength-tunable light source device 200. Specifically, the control device 300 sets the SOA current at, for example, the three levels of 100 mA, 300 mA, and 500 mA, and performs the wavelength measurement at the three levels, and the control device 300 adjusts the emission wavelength at each of the SOA currents so as to obtain a measurement value of the wavelength equal to the set wavelength, and obtains the PD current ratio and the etalon temperature at each of the SOA currents. Next, the control device 300 selects either one of the parameters of the PD current ratio offset and the etalon temperature offset, and uses a value of the selected parameter at the SOA current of 100 mA as a reference to fit a difference of the selected parameter from the reference with a quadratic function, and the control device 300 records a coefficient of the selected parameter obtained by the fitting in the memory 360 of a different wavelength-tunable light source device 200. In the case where the PD current ratio offset is selected, the control device 300 keeps the etalon temperature constant regardless of the SOA current during the wavelength measurement. In the case where the etalon temperature offset is selected, the control device 300 keeps the PD current ratio constant regardless of the SOA current during the wavelength measurement. In this method, the wavelength calibration is not performed at a plurality of SOA currents. Thus, this method can contribute to productivity.

When the control device 300 employs the correction method of changing the PD current ratio target value as a function of the square of the SOA current while keeping the same etalon temperature target value, the control device 300 sets the control target value of the etalon filter 232 by adjusting the etalon temperature such that the PD current ratio target value is preferably located in a linear portion of the wavelength discrimination curve regardless of any SOA current. This is for preventing the correction of the SOA current from being inaccurate, which can occur in a nonlinear portion.

Processing by Arithmetic Unit

Figure 12:
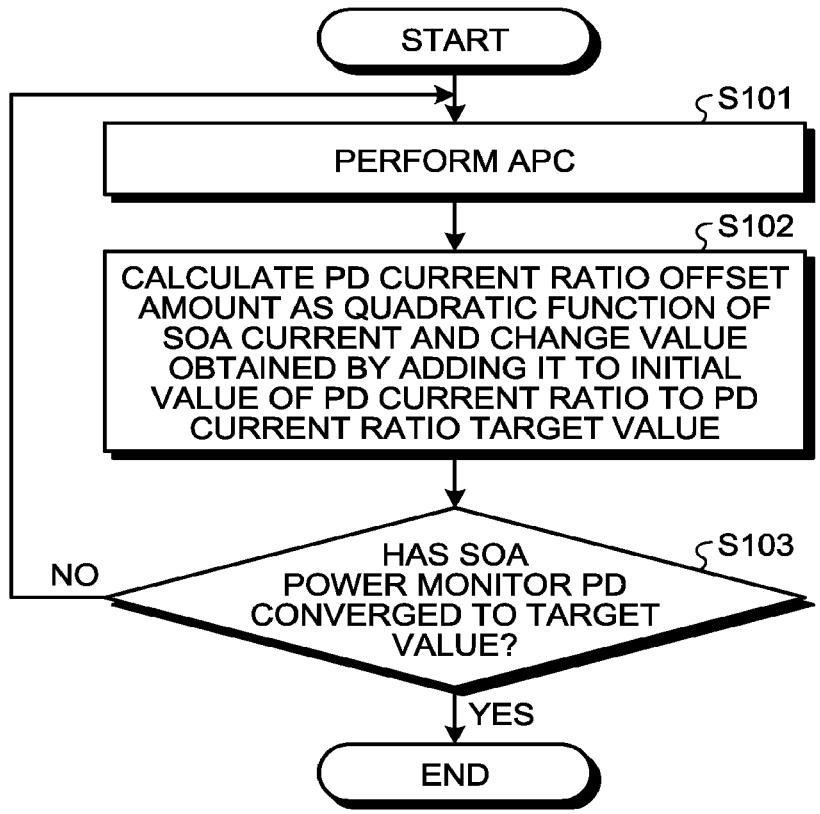
FIG. 12 is a flowchart illustrating an outline of processing performed by an arithmetic unit of the optical module according to the first embodiment.

The following describes processing performed by the arithmetic unit 370. FIG. 12 is a flowchart illustrating an outline of the processing performed by the arithmetic unit 370. Before performing the processing in FIG. 12, the arithmetic unit 370 has performed the AFC, for example, in a state in which the wavelength-tunable light source device 200 does not perform the fiber output (the SOA current is not flowing). The PD current ratio target value is a value obtained by adding, to the initial value thereof, an offset value calculated by setting the SOA current to 0 mA in the quadratic function.

As illustrated in FIG. 12, first, when a request signal for the optical power is received from an external control device, the arithmetic unit 370 performs the APC while performing the AFC (Step S101). In this case, the arithmetic unit 370 finely adjusts the SOA current by performing the feedback control so as to converge the current value received from the PD3 to the target value.

Subsequently, the arithmetic unit 370 calculates the PD current ratio offset amount (correction amount) as the quadratic function of the SOA current each time the feedback of the APC is performed (each time the SOA current is finely adjusted), and changes the calculation result to the PD current ratio target value (Step S102).

Then, the arithmetic unit 370 determines whether the current value received from the PD3 has converged to the target value (Step S103), and if so (Yes at Step S103), ends this process. If not (No at Step S103), the arithmetic unit 370 returns the process to Step S101 described above.

According to the first embodiment described above, in the case where the SOA 240 is placed on the same TEC 290, the lock wavelength can be prevented from drifting in the wavelength direction even when the optical power is changed.

Second Embodiment

The following describes a second embodiment of the present disclosure. The second embodiment differs from the above-described first embodiment in configuration.

Specifically, the second embodiment uses an integrated laser device. In the following description, the configuration of the second embodiment will be described, and then processing performed by an optical module according to the second embodiment will be described. The same components as those of the optical module 100 according to the above-described first embodiment will be denoted by the same reference numerals, and will not be described again.

Configuration of Optical Module

Figure 13:
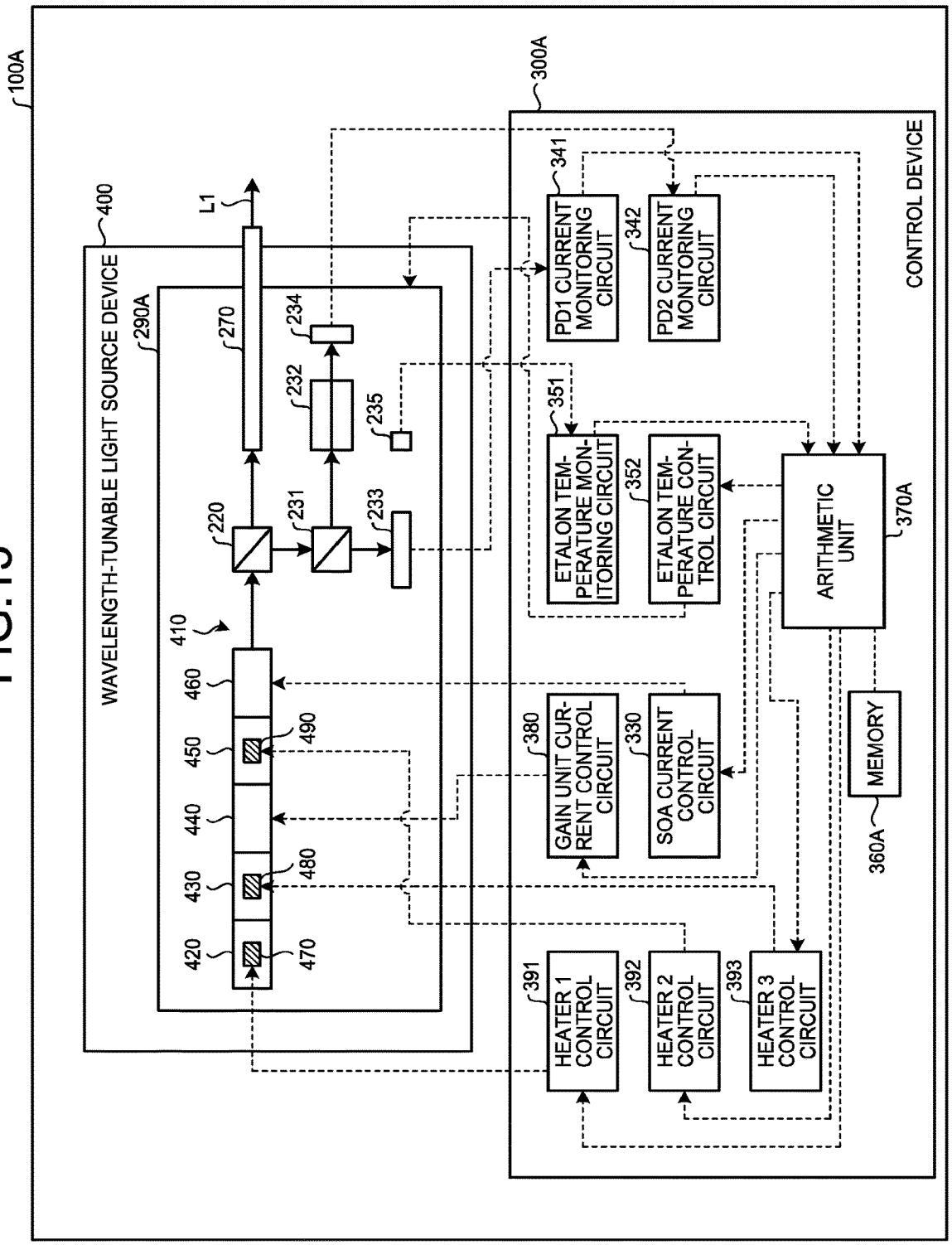
FIG. 13 is a block diagram schematically illustrating a configuration of an optical module according to a second embodiment of the present disclosure.

FIG. 13 is a block diagram schematically illustrating a configuration of the optical module according to the second embodiment. An optical module 100A illustrated in FIG. 13 includes a wavelength-tunable light source device 400 and a control device 300A instead of the wavelength-tunable light source device 200 and the control device 300 of the above-described first embodiment.

Configuration of Wavelength-Tunable Light Source Device

First, a detailed configuration of the wavelength-tunable light source device 400 will be described.

The wavelength-tunable light source device 400 includes an integrated laser device 410 and a TEC 290A instead of the laser light source unit 210 and the TEC 290 described above.

The integrated laser device 410 includes a first wavelength selecting unit 420, a phase adjusting unit 430, a gain unit 440, a second wavelength selecting unit 450, and an SOA 460. The integrated laser device 410 may be a monolithic integrated laser device, but is not limited thereto, and may be a hybrid integrated laser device combining a Si waveguide with a gain chip.

The first wavelength selecting unit 420 is a reflective element that generates a first comb-like reflection spectrum that changes in optical characteristic depending on the refractive index. The first wavelength selecting unit 420 is provided with a first heater unit 470 (hereinafter, simply called "Heater 1"). The control device 300A to be described later can control Heater 1 to change the optical characteristic of the first comb-like reflection spectrum in the first wavelength selecting unit 420, more specifically, can shift reflection peaks with respect to the wavelength.

Heater 1 is, for example, a microheater, and uses a current supplied from the control device 300A to change the temperature of the first wavelength selecting unit 420 so as to change the refractive index using a physical property of the first wavelength selecting unit 420.

The second wavelength selecting unit 450 is also a reflective element that generates a second comb-like reflection spectrum that changes in optical characteristic depending on the refractive index, and has a spectral interval different from that of the first comb-like reflection spectrum in the first wavelength selecting unit 420. In the same way as the first wavelength selecting unit 420, the second wavelength selecting unit 450 is provided with a second heater unit 490 (hereinafter, simply called "Heater 2"). The control device 300A to be described later can control Heater 2 to change the optical characteristic of the second comb-like reflection spectrum in the second wavelength selecting unit 450, more specifically, can shift reflection peaks with respect to the wavelength.

Heater 2 is, for example, a microheater, and uses a current supplied from the control device 300A to change the temperature of the second wavelength selecting unit 450 so as to change the refractive index using a physical property of the second wavelength selecting unit 450.

The first wavelength selecting unit 420 and the second wavelength selecting unit 450 form a pair to constitute a laser resonator. Each of the first wavelength selecting unit 420 and the second wavelength selecting unit 450 has a comb-like reflection spectrum in which the reflection peaks are substantially periodically formed with respect to the wavelength. The reflection peak interval of the comb-like reflection spectrum slightly differs between the first wavelength selecting unit 420 and the second wavelength selecting unit 450. Therefore, the wavelength of only one of the reflection peaks of the first wavelength selecting unit 420 matches that of the second wavelength selecting unit 450. Accordingly, the laser resonator constituted by the pair of the first wavelength selecting unit 420 and the second wavelength selecting unit 450 emits a laser beam having a narrow width with respect to the matched wavelength.

The first wavelength selecting unit 420 is provided with Heater 1, and the second wavelength selecting unit 450 is provided with Heater 2, so that the reflection peaks can be independently shifted. This shift also changes the wavelength of the matched reflection peak, so that the laser resonator constituted by the pair of the first wavelength selecting unit 420 and the second wavelength selecting unit 450 can emit the laser beam at a broad bandwidth.

The laser resonator constituted by the pair of the first wavelength selecting unit 420 and the second wavelength selecting unit 450 includes the phase adjusting unit 430, the gain unit 440, and the SOA 460.

The phase adjusting unit 430 is a unit for changing the refractive index to adjust a cavity length of the laser resonator constituted by the pair of the first wavelength selecting unit 420 and the second wavelength selecting unit 450. The phase adjusting unit 430 is provided with a third heater unit 480 (hereinafter, simply called "Heater 3").

Heater 3 is, for example, a microheater, and uses a current supplied from the control device 300A to change the temperature of the phase adjusting unit 430 so as to change the refractive index using a physical property thereof.

The gain unit 440 uses a driving current supplied from the control device 300A to supply energy to the laser resonator constituted by the pair of the first wavelength selecting unit 420 and the second wavelength selecting unit 450 so as to generate an optical amplification gain. That is, the control device 300A can control the power of the laser beam emitted by the integrated laser device 410 by controlling the current supplied to the gain unit 440.

The SOA 460 uses a driving current supplied from the control device 300A to amplify the laser beam emitted from the laser resonator, and emits the amplified laser beam to the optical demultiplexer 220.

The TEC 290A is configured using, for example, a Peltier element, and adjusts the temperature of the etalon filter 232 under the control of the control device 300A. The integrated laser device 410, the optical demultiplexer 220, the optical demultiplexer 231, the etalon filter 232, the PD1, the PD2, and the filter temperature monitoring element 235 are placed on the TEC 290A. Heater 1, Heater 2, Heater 3, the gain unit 440, and the SOA 460 of the integrated laser device 410 are placed on the same TEC 290A on which the etalon filter 232 is placed, and therefore, affect the temperature sensed by the etalon filter 232 by generating heat when the current flows.

Configuration of Control Device

The following describes a configuration of the control device 300A.

The control device 300A includes the SOA current control circuit 330, the PD1 current monitoring circuit 341, the PD2 current monitoring circuit 342, the etalon temperature monitoring circuit 351, the etalon temperature control circuit 352, a memory 360A, an arithmetic unit 370A, a gain unit current control circuit 380, a heater 1 control circuit 391, a heater 2 control circuit 392, and a heater 3 control circuit 393.

Under the control of the arithmetic unit 370A, the gain unit current control circuit 380 supplies the driving current to be supplied to the gain unit 440, and controls the driving current.

Under the control of the arithmetic unit 370A, the heater 1 control circuit 391 supplies a driving current to be supplied to Heater 1, and controls the driving current.

Under the control of the arithmetic unit 370A, the heater 2 control circuit 392 supplies a driving current to be supplied to Heater 2, and controls the driving current.

Under the control of the arithmetic unit 370A, the heater 3 control circuit 393 supplies a driving current to be supplied to Heater 3, and controls the driving current.

The memory 360A records data including the current of Heater 1, the current of Heater 2, the current of Heater 3, the gain unit current, the SOA current, the etalon temperature, the power monitor PD current value as the feedback control target value, and the PD current ratio, as the initial values for each of the wavelength channels. These pieces of data are acquired by the wavelength calibration using the wavelength meter and recorded in the memory 360A before shipping the wavelength-tunable light source device 400. The memory 360A records various programs to be executed by the arithmetic unit 370A. Voltages or power values can be recorded as initial values instead of the currents of the heaters. (The voltages or power values can be converted into the currents.)

The arithmetic unit 370A controls the driving current supplied by the etalon temperature control circuit 352 to the TEC 290A based on the etalon temperature received from the etalon temperature monitoring circuit 351 so as to keep the etalon temperature constant at the target value thereof. The arithmetic unit 370A controls the heater 1 control circuit 391, the heater 2 control circuit 392, and the heater 3 control circuit 393 to adjust the heating by Heater 1, Heater 2, and Heater 3 so as to adjust the emission wavelength of the integrated laser device 410, thus performing the AFC with the target value of the PD current ratio set to the value recorded in the memory 360A to keep the wavelength constant.

The arithmetic unit 370A controls the SOA current supplied by the SOA current control circuit 330 so as to perform the APC with the target value of the current value of the power monitor 260 set to the initial value recorded in the memory 360A to keep the fiber output power constant.

General Discussion of Method for Control

Figure 14A:
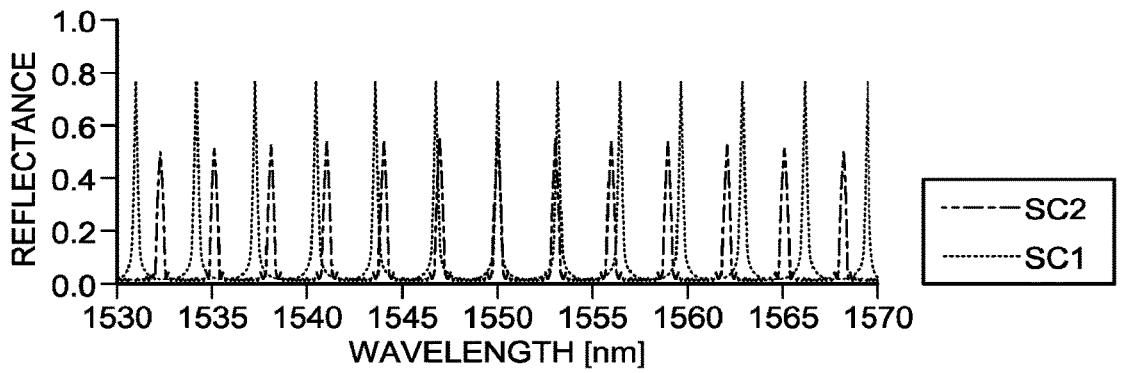
FIGS. 14A and 14B are diagrams illustrating reflection characteristics of a first wavelength selecting unit and a second wavelength selecting unit of the optical module according to the second embodiment.
Figure 14B:
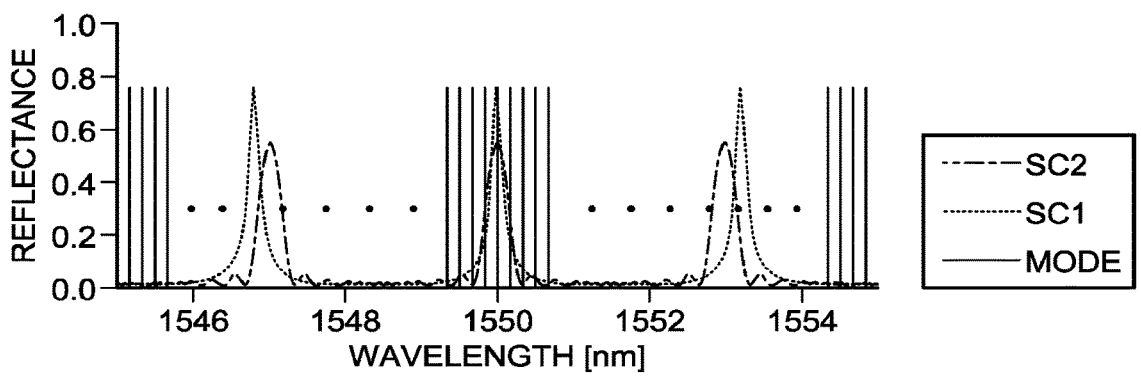

A general discussion of a method for controlling the integrated laser device 410 using the Vernier effect will be described by way of an example of the configuration described above. FIGS. 14A and 14B are diagrams illustrating reflection characteristics of the first wavelength selecting unit 420 and the second wavelength selecting unit 450. FIG. 14B is a diagram obtained by magnifying a portion of the reflection spectrum near a wavelength of 1550 nm in FIG. 14A. Common to both graphs illustrated in FIGS. 14A and 14B is that the horizontal axis represents the wavelength, and the vertical axis represents reflectance. A dotted line (SC1) represents the first comb-like reflection spectrum in the first wavelength selecting unit 420, and a long dashed short dashed line (SC2) represents the second comb-like reflection spectrum in the second wavelength selecting unit 450. Solid lines (Mode) illustrated in the graph of FIG. 14B represent resonator modes of the laser resonator constituted by the pair of the first wavelength selecting unit 420 and the second wavelength selecting unit 450. The resonator modes are present at least over a wavelength range of 1530 nm to 1570 nm.

Figure 15:
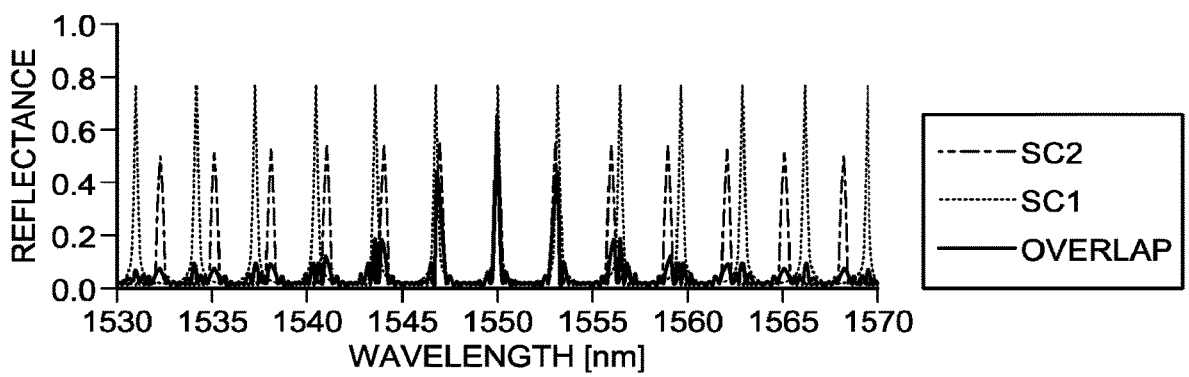
FIG. 15 is a diagram illustrating overlapping between a first comb-like reflection spectrum and a second comb-like reflection spectrum.

FIG. 15 is a diagram illustrating overlapping between the first comb-like reflection spectrum and the second comb-like reflection spectrum. In the graph illustrated in FIG. 15, in the same way as in FIGS. 14A and 14B, the horizontal axis represents the wavelength, and the vertical axis represents the reflectance. The dotted line (SC1) represents the first comb-like reflection spectrum in the first wavelength selecting unit 420, and the long dashed short dashed line (SC2) represents the second comb-like reflection spectrum in the second wavelength selecting unit 450. In addition, in the graph illustrated in FIG. 15, a solid line (Overlap) represents a spectrum obtained by overlapping (taking a product of) the first comb-like reflection spectrum (SC1) with the second comb-like reflection spectrum (SC2).

As can be understood from FIGS. 14A and 14B, the first comb-like reflection spectrum (SC1) in the first wavelength selecting unit 420 slightly differs from the second comb-like reflection spectrum (SC2) in the second wavelength selecting unit 450 in interval between reflection peaks. Accordingly, the wavelength of only one of the reflection peaks of the first wavelength selecting unit 420 matches that of the second wavelength selecting unit 450. That is, in the example illustrated in FIGS. 14A and 14B, the matching occurs only at a wavelength of 1550 nm. As a result, as can be understood from FIG. 15, the spectrum (Overlap) obtained by overlapping the first comb-like reflection spectrum (SC1) with the second comb-like reflection spectrum (SC2) has the highest overlap at the wavelength of 1550 nm.

As illustrated in FIGS. 14A and 14B, the reflection peaks of the first comb-like reflection spectrum (SC1) are steeper and spaced at larger intervals than those of the second comb-like reflection spectrum (SC2). In this way, the intervals of the steeper reflection peaks are preferably larger than those of the less steep reflection peaks. This is because the laser emission can be more strongly suppressed (the side mode suppression ratio can be increased) at peaks adjacent to the most highly overlapping peaks. That is, taking an example of FIG. 15, peaks (peaks near 1547 nm) adjacent to those at the wavelength of 1550 nm are less highly overlapping.

As already described, the first wavelength selecting unit 420 is provided with Heater 1; the second wavelength selecting unit 450 is provided with Heater 2; and the first comb-like reflection spectrum (SC1) and the second comb-like reflection spectrum (SC2) can be independently shifted. FIG. 15 illustrates a state in which coarse adjustment has been performed to emit a laser beam at the wavelength of 1550 nm, that is, a state in which what is called a supermode has been determined.

The phase adjusting unit 430 can adjust the cavity length of the laser resonator constituted by the pair of the first wavelength selecting unit 420 and the second wavelength selecting unit 450 to finely adjust the resonator modes. As described above, after the first comb-like reflection spectrum (SC1) is matched with the second comb-like reflection spectrum (SC2), the supermode is matched with one of the resonator modes, and the laser resonator constituted by the pair of the first wavelength selecting unit 420 and the second wavelength selecting unit 450 emits the laser beam.

The following method is used to change the wavelength of the laser emission. For example, the refractive index in the second wavelength selecting unit 450 is increased while the refractive index in the first wavelength selecting unit 420 is fixed. This operation shifts the overall second comb-like reflection spectrum (SC2) in the second wavelength selecting unit 450 toward a long wavelength side. As a result, while the overlapping of the peaks between the first comb-like reflection spectrum (SC1) and the second comb-like reflection spectrum (SC2) has been maximized at the wavelength of 1550 nm, the overlapping is maximized at another peak (near a wavelength of 1553 nm) present on the long wavelength side (shift of the supermode). When the resonator mode is further finely adjusted using the phase adjusting unit 430, the laser emission can also be obtained near the wavelength of 1553 nm.

To shift the laser emission toward a short wavelength side, the same adjustment as the above-described adjustment only needs to be performed by increasing the refractive index in the first wavelength selecting unit 420 while fixing the refractive index in the second wavelength selecting unit 450. The wavelength of the laser emission can also be changed over the wavelength range of 1530 nm to 1570 nm by adjusting both the refractive index in the first wavelength selecting unit 420 and the refractive index in the second wavelength selecting unit 450.

Countermeasure against Wavelength Shift Caused by Influence of Heat Generated by Heat Generating Bodies on Etalon Temperature The following describes a countermeasure against the wavelength shift caused by the influence of the heat generated by the heat generating bodies on the etalon temperature.

The heat generated by each of the heat generating bodies can be represented using the square of the current. Specifically, generated heat $Q_{heater}$ of each of the heaters can be represented by Expression (4) below using a current $I_{heater}$ of each of the heaters and a series resistance $R_{heater}$ of each of the heaters.

$$Q_{heater}=((I_{heater})^2)*R_{heater} \qquad (4)$$

The generated heat $Q_{soa}$ the SOA 460 can be represented by Expression (3) given above. In addition, generated heat $Q_{LD}$ of the gain unit 440 can be represented by Expression (5) below using a driving voltage $V_{LD}$ of the gain unit 440, a current $I_{LD}$ of the gain unit 440, optical power $P_{LD}$ from the gain unit 440, a series resistance $R_{d\_LD}$ of the gain unit 440, and a threshold voltage $V_{th\_LD}$ of the gain unit 440.

$$Q_{LD}=I_{LD}*(R_{d\_LD}*I_{LD}+V_{th\_LD})-P_{LD} \qquad (5)$$

To keep the same wavelength even if the current of each of the heat generating bodies changes, the arithmetic unit 370A uses one of the following two correction methods.

A correction method (Correction Method 1) of changing the PD current ratio target value while keeping the same etalon temperature target value.

A correction method (Correction Method 2) of changing the etalon temperature target value while keeping the same PD current ratio target value.

That is, the arithmetic unit 370A uses the initial value recorded in the memory 360A as the etalon temperature target value before the fiber output. Then, after starting to conduct the current to the SOA to output the light from the wavelength-tunable light source device 400, the arithmetic unit 370A corrects the PD current ratio target value or the etalon temperature target value. In this way, the arithmetic unit 370A represents the influence from each single body of the heat generating bodies as a function of a square of the current of the heat generating body, and sums the influences of all the heat generating bodies to correct the PD current ratio target value or the etalon temperature target value.

Processing of Arithmetic Unit

Figure 16:
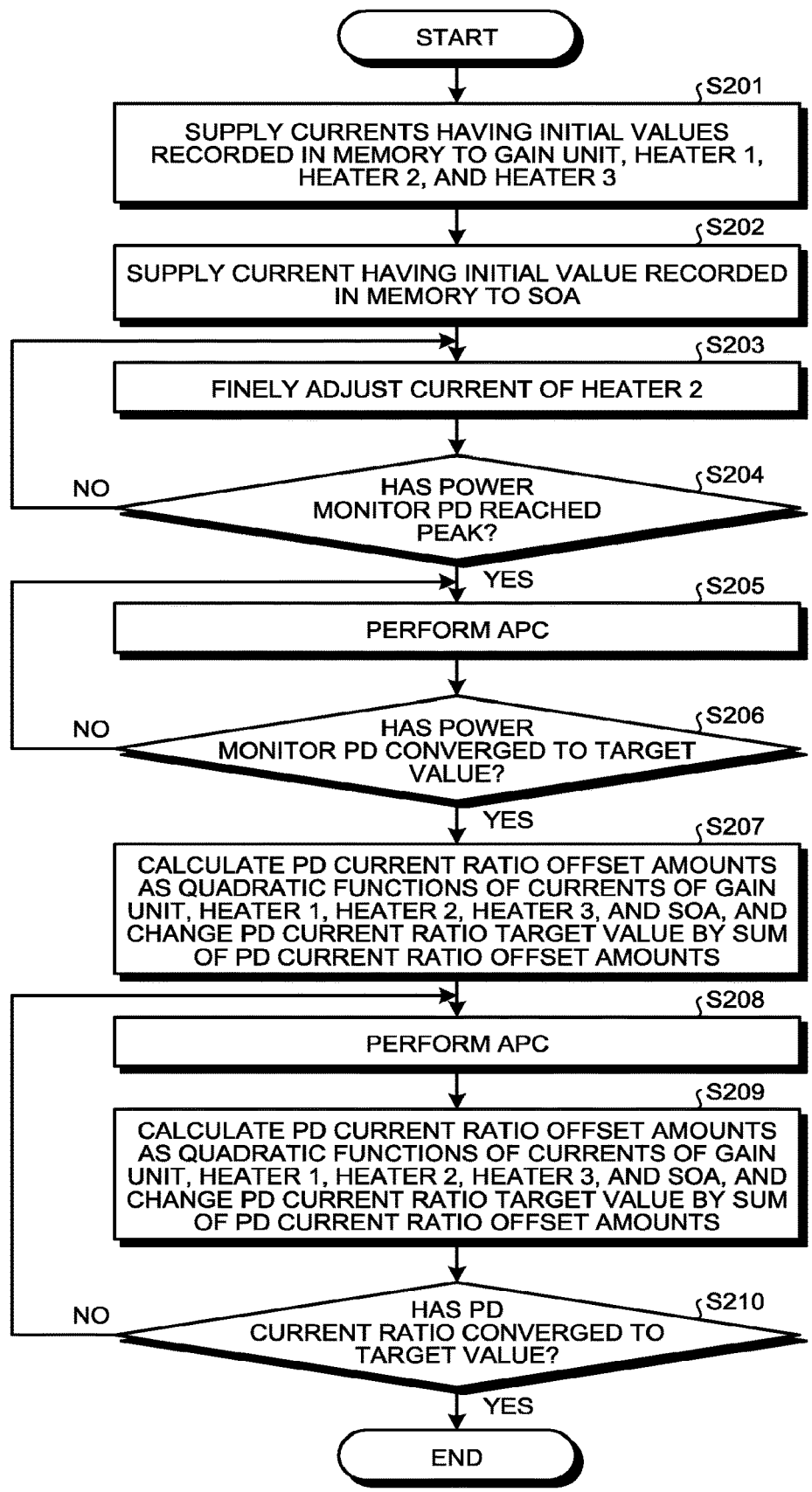
FIG. 16 is a flowchart illustrating an outline of processing performed by an arithmetic unit of the optical module according to the second embodiment.

The following describes processing performed by the arithmetic unit 370A. FIG. 16 is a flowchart illustrating an outline of the processing performed by the arithmetic unit 370A.

As illustrated in FIG. 16, first, when a request signal for the optical power is received from an external control device, the arithmetic unit 370A supplies currents having initial values recorded in the memory 360A to the gain unit 440, Heater 1, Heater 2, and Heater 3 (Step S201), and supplies a current having an initial value recorded in the memory 360A to the SOA 460 (Step S202).

Subsequently, the arithmetic unit 370A finely adjusts the current of Heater 2 such that a current value detected by the PD1 reaches a peak (Step S203), and if the current value detected by the PD1 has reached the peak (Yes at Step S204), performs the APC (Step S205). After Step S205, the arithmetic unit 370A performs processing at Step S206 to be described later. If the current value detected by the PD1 has not reached the peak (No at Step S204), the arithmetic unit 370A returns the process to Step S203.

If, at Step S206, the current value detected by the PD1 has converged to a target value (Yes at Step S206), the arithmetic unit 370A performs processing at Step S207 to be described later. If the current value detected by the PD1 has not converted to the target value (No at Step S206), the arithmetic unit 370A returns the process to Step S205 to perform the feedback control.

At Step S207, the arithmetic unit 370A calculates the PD current ratio offset amounts (correction amounts) as quadratic functions of the respective currents of the gain unit 440, Heater 1, Heater 2, Heater 3, and the SOA 460, and changes the PD current ratio target value by the sum of the PD current ratio offset amounts (correction amounts). That is, the arithmetic unit 370A changes the PD current ratio target value by summing the correction amounts that are contributions from the gain unit 440, Heater 1, Heater 2, Heater 3, and the SOA 460.

Subsequently, the arithmetic unit 370A performs the APC (Step S208), and each time the respective currents of Heater 1, Heater 2, and Heater 3 are fed back (each time the respective currents of Heater 1, Heater 2, and Heater 3 are finely adjusted), the arithmetic unit 370A calculates the PD current ratio offset amounts as the quadratic functions of the respective currents of the gain unit 440, Heater 1, Heater 2, Heater 3, and the SOA 460, and changes the PD current ratio target value by the sum of the PD current offset amounts (Step S209).

Then, if the PD current ratio has converged to the target value (Yes at Step S210), the arithmetic unit 370A ends this process. If the PD current ratio has not converged to the target value (No at Step S210), the arithmetic unit 370A returns the process to Step S208.

According to the second embodiment described above, in the case where the gain unit 440, Heater 1, Heater 2, Heater 3, and the SOA 460 are placed on the same TEC 290A, the lock wavelength can be prevented from drifting in the wavelength direction even when the optical power is changed. The heaters may be controlled by voltages or power. Since the resistance values of the heaters change with temperature depending on the material thereof, the PD current ratio offset amount and the etalon temperature offset amount may each be calculated so as to be fitted with a function of higher order than a quadratic function of the heater current.

Other Embodiments

In the description of the flowcharts herein, the expressions such as "first", "then", and "subsequently" have been used to indicate the temporal order of the processing between steps. However, the order of the processing required to carry out the present disclosure is not uniquely determined by those expressions. That is, the order of the processing in the flowcharts described herein can be changed within a range not causing contradictions.

In the present specification, the term "unit" mentioned above can be replaced with, for example, "means", "circuit", or "device". For example, the term "arithmetic unit" can be replaced with "arithmetic means", "arithmetic circuit", or "arithmetic device".

The present disclosure provides an effect that, when the heat generating bodies are placed on the same temperature controller, the lock wavelength can be prevented from drifting in the wavelength direction even when the optical power is changed.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A method for controlling a wavelength of an optical module, the optical module including:
    a laser light source unit configured to emit a laser beam;
    a wavelength filter having a periodical transmission characteristic with respect to a wavelength of light;
    a temperature controller on which the wavelength filter is placed and that is configured to adjust a temperature of the wavelength filter;
    a heat generating body placed on the temperature controller; and
    a control device configured to control the wavelength of the laser beam emitted from the laser light source unit and control the transmission characteristic of the wavelength filter based on an intensity of the laser beam transmitted through the wavelength filter,
    the method comprising changing at least one of a target value of the wavelength control of the laser beam and a target value of the control of the wavelength filter based on a current value of the heat generating body, wherein:
        the changing including changing a correction amount from an initial value of the target value based on the current value of the heat generating body, and
        the changing includes using a quadratic function of the current value of the heat generating body to calculate the correction amount from the initial value of the target value.

2. A method for controlling a wavelength of an optical module, the optical module including:
    a laser light source unit configured to emit a laser beam;
    a wavelength filter having a periodical transmission characteristic with respect to a wavelength of light;
    a temperature controller on which the wavelength filter is placed and that is configured to adjust a temperature of the wavelength filter;
    a heat generating body placed on the temperature controller; and
    a control device configured to control the wavelength of the laser beam emitted from the laser light source unit and control the transmission characteristic of the wavelength filter based on an intensity of the laser beam transmitted through the wavelength filter,
    the method comprising changing at least one of a target value of the wavelength control of the laser beam and a target value of the control of the wavelength filter based on a current value of the heat generating body, wherein:
        the heat generating body is an SOA, and
        the changing includes, when an SOA current value supplied to the SOA is changed, changing the correction amount from the initial value of the target value in accordance with the SOA current value.

3. A method for calibrating an optical module, the optical module including:
    a laser light source unit configured to emit a laser beam;
    a wavelength filter having a periodical transmission characteristic with respect to a wavelength of light;
    a temperature controller on which the wavelength filter is placed and that is configured to adjust a temperature of the wavelength filter;
    a heat generating body placed on the temperature controller;
    a first light receiving element configured to receive the laser beam which has not been transmitted through the wavelength filter, and output a current value based on an intensity of the received laser beam;

a second light receiving element configured to receive the laser beam which has been transmitted through the wavelength filter, and output a current value based on an intensity of the received laser beam; and a control device configured to control the wavelength of the laser beam emitted from the laser light source unit and control the transmission characteristic of the wavelength filter based on an intensity of the laser beam transmitted through the wavelength filter, the method comprising:

fitting by performing wavelength calibration at a plurality of current values of the heat generating body, and performing fitting on at least one of a difference between a current ratio between the current value output from the first light receiving element and the current value output from the second light receiving element at a reference current value among the current values, and a current ratio between the current value output from the first light receiving element and the current value output from the second light receiving element at a current value other than the reference current value among the current values, and a difference between a wavelength filter temperature of the wavelength filter at the reference current value among the current values, and a wavelength filter temperature of the wavelength filter at a current value other than the reference current value among the current values; and recording a coefficient obtained by the fitting into a memory.

4. The method for calibrating an optical module according to claim 3, wherein the fitting includes setting a target value of the control of the wavelength filter by adjusting the wavelength filter temperature such that a target value of the wavelength control of the laser beam is located in a linear portion or near the linear portion of a wavelength discrimination curve.

5. An optical module comprising:
a laser light source unit configured to emit a laser beam;
a wavelength filter having a periodical transmission characteristic with respect to a wavelength of light;
a temperature controller on which the wavelength filter is placed and that is configured to adjust a temperature of the wavelength filter;
a heat generating body placed on the temperature controller; and
a control device configured to control the wavelength of the laser beam emitted from the laser light source unit and control the transmission characteristic of the wavelength filter based on an intensity of the laser beam transmitted through the wavelength filter, wherein
the control device is configured to change at least one of a target value of the wavelength control of the laser beam and a target value of the control of the wavelength filter based on a current value of the heat generating body and the change includes:
changing a correction amount from an initial value of the target value based on the current value of the heat generating body, and
using a quadratic function of the current value of the heat generating body to calculate the correction amount from the initial value of the target value.

6. The optical module according to claim 5, wherein the laser light source unit is capable of changing the wavelength of the laser beam.

7. An optical module comprising:
a laser light source unit configured to emit a laser beam;
a wavelength filter having a periodical transmission characteristic with respect to a wavelength of light;
a temperature controller on which the wavelength filter is placed and that is configured to adjust a temperature of the wavelength filter;
a heat generating body placed on the temperature controller; and
a control device configured to control the wavelength of the laser beam emitted from the laser light source unit and control the transmission characteristic of the wavelength filter based on an intensity of the laser beam transmitted through the wavelength filter, wherein
the control device is configured to change at least one of a target value of the wavelength control of the laser beam and a target value of the control of the wavelength filter based on a current value of the heat generating body, and wherein:
the heat generating body is an SOA, and
the changing includes, when an SOA current value supplied to the SOA is changed, changing the correction amount from the initial value of the target value in accordance with the SOA current value.

8. The optical module according to claim 7, wherein the laser light source unit is capable of changing the wavelength of the laser beam.

9. A method for controlling a wavelength of an optical module, the optical module including:
a laser light source unit configured to emit a laser beam;
a wavelength filter having a periodical transmission characteristic with respect to a wavelength of light;
a temperature controller on which the wavelength filter is placed and that is configured to adjust a temperature of the wavelength filter;
a heat generating body placed on the temperature controller in a state of affecting a temperature that the wavelength filter senses; and
a control device configured to control the wavelength of the laser beam emitted from the laser light source unit and control the transmission characteristic of the wavelength filter based on an intensity of the laser beam transmitted through the wavelength filter,
the method comprising changing at least one of a target value of the wavelength control of the laser beam and a target value of the control of the wavelength filter based on a current value of the heat generating body.

10. An optical module comprising:
a laser light source unit configured to emit a laser beam;
a wavelength filter having a periodical transmission characteristic with respect to a wavelength of light;
a temperature controller on which the wavelength filter is placed and that is configured to adjust a temperature of the wavelength filter;
a heat generating body placed on the temperature controller, in a state of affecting a temperature that the wavelength filter senses; and
a control device configured to control the wavelength of the laser beam emitted from the laser light source unit and control the transmission characteristic of the wavelength filter based on an intensity of the laser beam transmitted through the wavelength filter, wherein
the control device is configured to change at least one of a target value of the wavelength control of the laser beam and a target value of the control of the wavelength filter based on a current value of the heat generating body.

\* \* \* \* \*